(12) United States Patent
Benaissa et al.

(10) Patent No.: US 10,032,742 B2
(45) Date of Patent: Jul. 24, 2018

(54) METHOD FOR OBTAINING A BONDING SURFACE FOR DIRECT BONDING

(71) Applicant: COMMISSARIAT A L'ENERGIE ATOMIQUE ET AUX ENERGIES ALTERNATIVES, Paris (FR)

(72) Inventors: Lamine Benaissa, Massy (FR); Paul Gondcharton, Grenoble (FR); Bruno Imbert, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 293 days.

(21) Appl. No.: 14/764,072

(22) PCT Filed: Feb. 12, 2014

(86) PCT No.: PCT/FR2014/050269
§ 371 (c)(1),
(2) Date: Jul. 28, 2015

(87) PCT Pub. No.: WO2014/131960
PCT Pub. Date: Sep. 4, 2014

(65) Prior Publication Data
US 2015/0364442 A1    Dec. 17, 2015

(30) Foreign Application Priority Data
Feb. 28, 2013   (FR) ...................................... 13/51799

(51) Int. Cl.
*H01L 23/00*      (2006.01)
*H01L 21/18*      (2006.01)
*H01L 33/00*      (2010.01)

(52) U.S. Cl.
CPC ............ *H01L 24/83* (2013.01); *H01L 21/187* (2013.01); *H01L 33/0079* (2013.01);
(Continued)

(58) Field of Classification Search
CPC .......................... H01L 124/83; H01L 21/187
See application file for complete search history.

(56) References Cited

U.S. PATENT DOCUMENTS

2009/0286382 A1    11/2009   Huff

FOREIGN PATENT DOCUMENTS

EP    1684340 A2    7/2006
EP    2006887 A2    12/2008

OTHER PUBLICATIONS

Apr. 4, 2014 International Search Report issued in International Patent Application No. PCT/FR2014/050269.

*Primary Examiner* — John E Uselding
(74) *Attorney, Agent, or Firm* — Oliff PLC

(57) ABSTRACT

A process for obtaining a bonding surface for direct bonding includes: a) providing a substrate based on a sintered metal having a base surface with an RMS roughness lower than 6 nanometers and a PV roughness lower than 100 nanometers; b) bombarding the base surface with ionic species; c) depositing a metal layer on the base surface; and d) carrying out a mechanical and/or chemical polish of an exposed surface of the metal layer. A structure including a substrate based on a sintered metal the base surface of which is at least partially formed from a metal including ionic species implanted by bombardment of the base surface, and a metal layer of identical chemical composition to that of the metal base substrate and including a bonding surface with an RMS roughness lower than 0.6 nanometers and a PV roughness lower than 10 nanometers is also provided.

15 Claims, 1 Drawing Sheet

(52) U.S. Cl.
CPC ............... *H01L 2224/83031* (2013.01); *H01L 2224/83047* (2013.01); *H01L 2924/12041* (2013.01); *H01L 2924/12043* (2013.01); *H01L 2924/157* (2013.01); *Y10T 428/12493* (2015.01); *Y10T 428/12528* (2015.01)

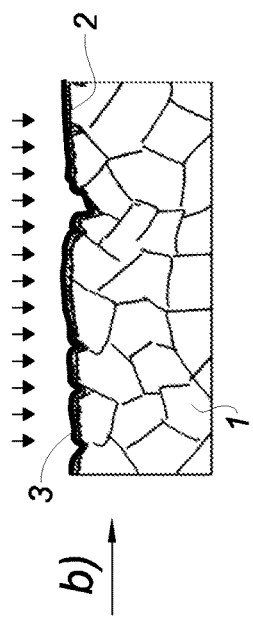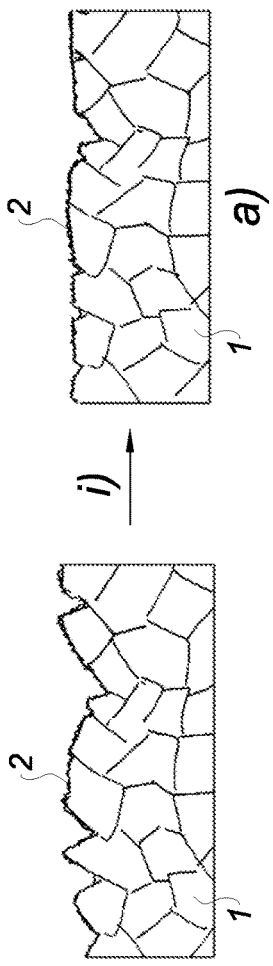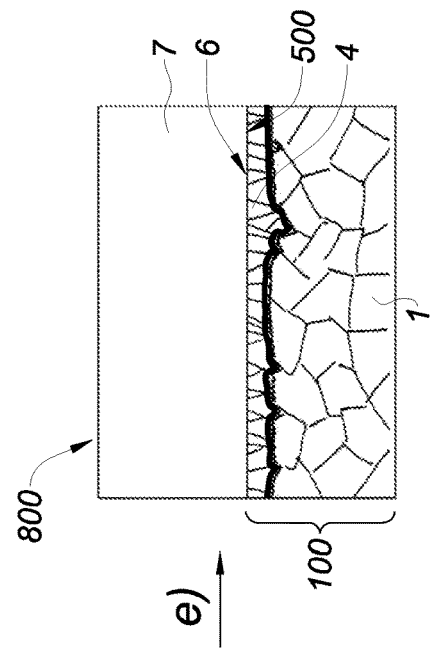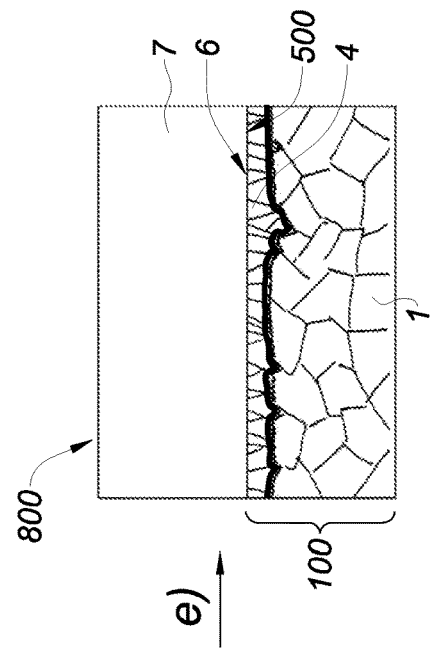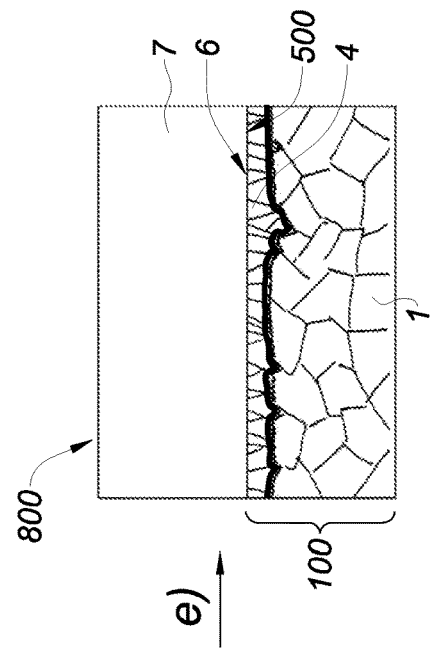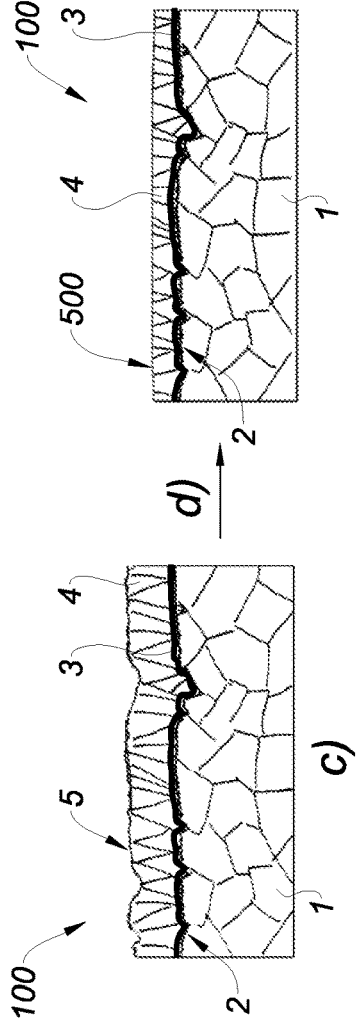

METHOD FOR OBTAINING A BONDING SURFACE FOR DIRECT BONDING

BACKGROUND

Technical Field

The present invention concerns a method for obtaining a bonding surface of a sintered metallic support substrate in order to perform a direct bonding on a receiver substrate. The invention also concerns a structure comprising a sintered metallic support substrate bonded by direct bonding to a receiver substrate comprising a functionalized layer of a semiconductor material.

Related Art

In the semiconductor materials industry, direct metallic bonding is a widely used technology for ensuring assembly of two substrates presenting metallic bonding layers, and in particular, for leading to functionalized 3D structures.

Nowadays, in an increasing number of applications such as lighting, photovoltaics and power, it turns out to be interesting to use direct bonding for assembling substrates that are functionalized by components for LEDs, solar cells, power diodes or transistors, etc. with solid metallic substrates. Not only direct bonding is reliable but the use of an electrical and thermal conductive metallic substrate offers also the possibility of forming a common electrode to the components, while allowing to provide a heat sink for the thermal dissipation and/or for example an electromagnetic shield like a Faraday cage.

Nonetheless, the heterostructure which assembled by direct bonding is sensitive to the differences of the Coefficients of Thermal Expansion (CTE) of the different involved materials. Hence, it is advantageous to choose a metallic substrate based on materials that present CTEs that are as close as possible to the most commonly used semiconductor materials, such as Si (3 ppm/K), Ge (5.8 ppm/K), SiC (2.7 ppm/K), GaN (5.6 ppm/K). The refractory transition metals, that is to say with a high melting temperature, are preferred, such as Molybdenum (7 ppm/K) or Tungsten (5.7 ppm/K) which have a much lower CTE than that of Copper (17 ppm/K) or Aluminum (23.1 ppm/K). In addition, these materials have the advantage of having a quite good behavior at high temperature, such as 900° C., and a low sensitivity to corrosion.

Almost all solid substrates that are composed of these metals are obtained by metallurgy of the powders, and more specifically by sintering (powder compaction) and only a low proportion, for example 5 to 10% of the Molybdenum substrates, is produced by electro-fusion in a consumable electrode arc furnace or an electron beam furnace.

The electro-fused substrates present a morphology and thermomechanical properties which are much more homogenous than those of the sintered substrates, thereby making their machining, polishing and preparation much simpler. For example, these electro-fused substrates are used as mirrors (i.e. RMS (Root Mean Square) roughness<1 nm) in very specific applications (industrial laser, etc.). However, their high cost makes their use impossible in numerous applications that involve components based on semiconductor materials.

For these applications, the best economical option remains the use of sintered substrates. However, the gain in the cost of the material is done at the expense of the quality of the sintered substrates. Indeed, the latter are systematically polycrystalline and present grains that are inhomogeneous in terms of orientations, size (typically from 1 to 10 μm) and mechanical properties (hardness, density, etc.). Consequently, the sintered substrates are much more difficult to prepare, and in particular to polish, than the electro-fused material substrates whose behavior is much more predictable.

In order to prepare these sintered substrates, different methods exist but they do not allow to obtain a satisfactory surface condition for a direct metallic bonding (RMS roughness<1 nm, absence of scratches, good flatness, etc.) within the conventional processes windows.

For example, the mechanical polishing allows to obtain good surface conditions in terms of RMS roughness but it introduces numerous defects where scratch is the main expression.

Moreover, the mechano-chemical polishing does not allow obtaining a satisfactory surface condition. Even though at the grain scale, a good roughness is obtained (RMS roughness<1 nm), the action of the chemical reactant remains highly sensitive to the nature and orientation of the grains and it is highly difficult to find stable conditions that can enable smoothing and planarization of the surface at the same time. Very aggressive conditions (a high concentration in oxidizing agent such as H2O2 for example) cause a drift of the polishing process with a degradation of flatness; less aggressive conditions worsen selectivity, thereby leading to an exacerbated revelation of the grains.

Another option for surface preparation consists in covering the substrate with a much softer and easy to work material such as Copper. A good behavior is observed when polishing a copper layer deposited over a sintered molybdenum substrate thereby making possible an assembly by direct bonding with a silicon receiver substrate comprising components. Nonetheless, a copper layer is introduced in the structure and due to the differences in CTE between the materials (Si//Cu//Mo), this layer causes reliability problems and failure modes by fatigue of the structure.

SUMMARY

The present invention aims to overcome one or more of these drawbacks. To this end, the present invention provides a method for obtaining a bonding surface of a sintered metallic support substrate adapted to direct bonding comprising the steps of:
  a) Providing a sintered metallic base substrate which presents a base surface including a RMS roughness lower than 6 nanometers and a PV roughness lower than 100 nanometers,
  b) Bombarding said base surface with ionic species,
  c) Depositing a metallic layer over said base surface, stacking of said base substrate and said metallic layer forming the metallic support substrate, and
  d) Performing a mechanical and/or chemical polishing of an exposed surface of the metallic layer so as to obtain the bonding surface adapted to the direct bonding.

By 'exposed surface of the metallic layer', it is meant, in the present document, the free surface of the deposited metallic layer located on the side opposite to the surface in contact with the base substrate.

Thanks to this combination of steps, the method of the invention allows in particular to obtain a bonding surface condition which makes it possible to carry out a direct bonding of a sintered metallic support substrate on a receiver substrate. The obtained bonding presents a good mechanical strength, compatible with its future integration.

The step b) of ionic bombardment of the base surface acts as a factor of homogenization of the structural and mechanical properties of the surface. In particular, this step allows isolating structural and mechanical properties of the base substrate from the metallic layer which is deposited subsequently at step c) and limits the revelation of the grains during step d) of mechanical and/or chemical polishing of the exposed surface.

Without referring to any scientific theory, it seems that the homogenization effect of step b) is twice and that this step affects both the deposition step c) and the mechanical and/or chemical polishing step d).

The hypothesis that may be suggested is that, on the structural level, the ions that have been accelerated by the bombardment jostle the ordered atoms of the crystalline structure of the base surface which results in amorphizing the material at the surface by creation of a chaos at the atomic scale composed of deficiencies, interstitials and dislocations. This amorphization of the surface is partial or total and it is also accompanied by a redistribution of roughness by pull-out of blocks of material (composed of several atoms and having a crystalline structure) and a natural re-deposition.

By proceeding this way, the structural chaos prevents an exact reproduction of the structural properties of the grains of the base substrate in the metallic layer deposited at the base surface. In addition, the levelling of the hardness of the material at the surface of the base substrate homogenizes the behavior of the deposited metallic layer vis-à-vis the mechanical and/or chemical polishing process. Thus, steps c) and d) which are carried out after step b) allow absorbing the PV roughness of the surface, for example in terms of scratches generated when preparing the base substrate, and smoothing and planarizing the exposed surface.

Thus, if step a) is directly followed by steps c) and d) or only by step d), a revelation of the grains is observed at the surface leading to a surface condition that is incompatible with the direct bonding technique. Hence, it is important to carry out the steps of the method in the indicated order.

Moreover, if steps b) to d) are carried out on a surface condition that is different from that of the base substrate of step a), the surface roughness that is compatible with a direct bonding is harder to obtain.

According to one arrangement, the ionic species bombarding step b) is carried out to amorphize, at least in part, the metal under the base surface. This metal amorphization then intervenes in the base substrate from the base surface and over a thickness that is smaller than or equal to 10 nanometers.

Advantageously, step d) is carried out so that the bonding surface presents a RMS roughness lower than 0.6 nanometers and a PV roughness lower than 10 nanometers. These values of roughness allow obtaining a very good direct bonding.

In the present document, the indicated values of RMS (Root Mean Square) roughness have been measured over a 5 micrometers×5 micrometers field, and the indicated values of PV (Peak to Valley) roughness have been measured over a 100*100 µm² field.

According to one possibility, prior to step a), the method comprises a step i) consisting in performing a mechanical polishing of the base surface. This mechanical polishing step i) allows planarizing and smoothing the surface independently of the chemical and crystalline nature of the worked material. It allows decreasing roughness considerably and effectively until achieving a RMS roughness of 6 nm and a PV roughness lower than 100 nm. Since this mechanical polishing step generates characteristic surface defects, such as scratches, making impossible a direct bonding, the successive steps a) to d) are essential in order to obtain a layer at the surface which is adapted to the direct bonding.

Advantageously, the deposited metallic layer is formed of the same metallic material as the sintered base substrate. Therefore, the material of the deposited metallic layer presents a CTE identical to that of the base substrate, which avoids the creation of stresses by different expansions or contractions depending on the materials during temperature variations.

Preferably, the method comprises a step e) carried out after step d), comprising a direct bonding of the bonding surface over a receiving surface of a receiver substrate. Thus, it is possible to form a structure that is stable over time, comprising two substrates bonded by direct bonding, without introducing any layer of material in particular glue, adhesive, etc., at the bonding interface between the metallic support substrate and the receiver substrate.

According to one arrangement, the direct bonding step e) is carried out at ambient temperature. Indeed, the RMS roughness and the PV roughness that are obtained by the previous steps allow for a direct bonding under very good conditions. Thus, it is possible to obtain a direct bonding without heat treatment.

Advantageously, the receiver substrate includes at least one functionalized layer of semiconductor material, at the receiving surface. In particular, the thermal and electrical conduction at the direct bonding interface allows forming a common electrode to the components manufactured in the functionalized layer of semiconductor material and a heat sink for improving the thermal dissipation. It also ensures an electromagnetic shielding.

Preferably, the functionalized layer comprises a monocrystalline material. Thus, the performances of the devices formed from this layer are optimized.

In variant, the receiver substrate is totally formed of a monocrystalline material.

According to one arrangement, the functionalized layer of semiconductor material forms the receiver substrate.

Preferably, the semiconductor material of the functionalized layer is chosen among silicon, germanium, SiGe, SiC, or binary, ternary, quaternary materials formed from the elements III and V such as GaN, GaAs, InP, InGaN, and AlGaN. Many components may be formed from these materials and their CTEs are close to those of the metals that form the metallic support substrate.

Preferably, the features of the functionalized layer of semiconductor material comprise components for LEDs, solar cells, power diodes or transistors. A functionalized 3D structure may thus be obtained.

According to one possibility, the base substrate comprises a sintered metallic material chosen among the refractory transition metals, preferably the metallic material is chosen among molybdenum, tungsten, tantalum, niobium and rhenium and the alloys of these different materials. These materials advantageously present CTEs that are close to the most commonly used semiconductor materials. Thus, their use in the manufacture of functionalized structures by direct bonding extends the durability of the structure, enables heat treatments at high temperatures and allows to decrease the manufacturing costs in comparison with the use of metallic substrates manufactured by electro-fusion.

According to one arrangement, the step b) of bombarding with, ionic species is carried out at a dose comprised between $1^E 13$ and $5^E 17$ at/cm² by ion implantation at an energy comprised between 500 eV and 250 keV or by plasma immersion at an energy comprised between 500 eV and 50 keV. These bombarding conditions allow for an effective amorphization of the material at the base surface while causing a structural hardening. The thickness of the implanted material is of at least 10 nm, typically in the order of 20 nm. Since the plasma immersion has a more superficial action, it will generally be preferred over the ion implantation.

Preferably, the ionic species are obtained from elements chosen among He, Ne, Ar, Kr, Xe. These ionic species, which come from rare gas, do not react with the implanted material under the used implantation (in particular doses) conditions.

These may consist of simple ionic species such as $He^+$ or multi-energized ionic species such as $He^{++}$.

Advantageously, the step c) of metallic layer deposition is carried out until reaching a layer thickness larger than or equal to three times the PV roughness of said base surface that has been obtained at step b). Indeed, such a layer thickness allows levelling the PV roughness of the base surface so that the scratches that are formed, for example at step i) of the method are not reproduced on the exposed surface of the deposited metallic layer.

Preferably, the deposition step c) is carried out at a temperature that is lower than third of the melting temperature of the metallic material of the deposited metallic layer. Thus, the defects that are created at the base surface by the ion bombarding of step b) are not restored by this thermal energy supply in the metallic layer.

According to a second aspect, the invention proposes a structure, in particular for applications in the field of LEDs, power and photovoltaics, characterized in that the structure comprises successively from its base to its surface, a sintered metallic base substrate whose base surface is formed, at least in part, of a metallic material comprising ionic species implanted by bombarding on the base surface, a metallic layer with a chemical composition identical to that of the metallic base substrate, stacking of the base substrate and of the metallic layer forming a sintered metallic support substrate including a bonding surface presenting a RMS roughness lower than 0.6 nanometers and a PV roughness lower than 10 nanometers.

Obtaining a bonding surface that presents such a RMS and PV roughness indicates the upstream use of homogenization of the mechanical and structural properties of the surface of the sintered base substrate, which thereby enables a direct bonding.

Advantageously, the bonding surface is sealed directly to a receiving surface of a receiver substrate by direct bonding. By 'sealed directly', it is meant, in the present document, that there is no material or any other intermediate layer at the bonding interface between the metallic support substrate and the receiver substrate.

Preferably, the receiver substrate comprises at least one functionalized layer of semiconductor material, preferably monocrystalline, at the receiving surface.

The direct contact between the metallic support substrate and the functionalized layer allows to facilitate electrical contact establishment of the components formed in the functionalized layer, it also facilitates the thermal dissipation of heat produced by the operation of the components while allowing for a bonding that is reliable over time.

Preferably, the metallic material of the sintered base substrate is chosen among the refractory transition metals, preferably the metallic material is chosen among molybdenum, tungsten, tantalum, niobium and rhenium and the alloys of these different materials, and the functionalized layer of semiconductor material forming the receiver substrate comprises Si, Ge, SiGe, SiC or binary, ternary, quaternary materials formed from the elements III and V such as GaN, GaAs, InP, InGaN, and AlGaN.

In this manner, the used materials present CTEs that are close to each other so that the formed structure is little sensitive to temperature changes. Moreover, since the materials of the metallic substrates used are inexpensive, manufacturing such a structure presents a reduced prime cost so that it may be used in numerous applications, in particular for consumer products.

BRIEF DESCRIPTION OF THE DRAWINGS

Other aspects, aims and advantages of the present invention will appear better upon reading the following description of an embodiment thereof, given as a non-limiting example and with reference to the appended drawings. In order to improve their readability, the figures do not necessarily comply with the scale of all represented elements. For simplicity, in the following description, identical, similar or equivalent elements of the different embodiments carry the same reference numerals.

FIGS. 1 to 5 schematically illustrate an embodiment of the method according to the invention.

FIG. 6 schematically illustrates a functionalized structure resulting from direct bonding according to an embodiment of the method of the invention.

DETAILED DESCRIPTION

FIG. 1 illustrates a solid metallic base substrate 1 made of sintered molybdenum, whose base surface 2 presents a RMS roughness comprised between 20 and 30 nanometers over a 5*5 $\mu m^2$ field and a PV roughness comprised between 150 and 250 nanometers measured by optical interferometry over a 100*100 $\mu m^2$ field. These characteristics correspond to the typical characteristics of sintered substrates that are currently in the market.

More generally, the base substrate 1 may be formed of a sintered refractory metal such as molybdenum, tungsten, tantalum, rhenium or niobium and an alloy of these metals.

FIG. 2 illustrates the step i) of the method which consists in performing a mechanical polishing on the base surface 2, for example with an aqueous solution of diamond on an abrasive pad. The RMS roughness of the base surface 2 obtained after this polishing is comprised between 2 and 6 nanometers, the PV roughness of the base surface 2 is comprised between 25 and 100 nanometers. Moreover, polishing on the base substrate 1 also generates scratches at the base surface 2, which depend on the used mechanical polishing technique. These scratches typically correspond to curved lines of at least 100 µm length (which generally extend from one end to the other of the surface), with a width ranging from 500 nm to 5 µm and a depth generally larger than 100 nm.

According to another possibility, the mechanical polishing may be carried out with an aqueous solution of alumina on an abrasive pad.

FIG. 3 illustrates the step b) of the method which consists in bombarding the base surface 2 of the molybdenum base substrate 1 with ionic species formed based on helium at a dose of $1^E16$ at/$cm^2$ and an energy of 10 keV. The bombarding is carried out by ion implantation, according to one variant, the bombarding may be carried out by plasma immersion. The amorphization of at least one portion of the metallic material at the base surface 2 of the base substrate 1 resulting from the bombarding with ionic species is schematically illustrated by a material film 3. The material of this film 3 has been structurally and mechanically homogenized over the base surface 2 of the base substrate 1 but it is understood, in the present document, that the homogenization does not necessarily take place over the totality of the base surface 2, that the film 3 may be continuous as well as discontinuous and that the homogenization may be distributed very irregularly in surface as well as in depth. The thickness of the area implanted by bombarding is larger than 10 nm and is typically in the order of 20 nm.

According to a variant which is not illustrated, the implanted ionic species may be formed based on Ne, Ar, Kr, Xe at a dose comprised between $1^E13$ at/cm$^2$ and $5^E17$ at/cm$^2$ and at an energy comprised between 500 eV and 250 keV.

Still according to another variant, bombarding ionic species is obtained by plasma immersion at an energy comprised between 500 eV and 50 keV.

FIG. 4 illustrates the step c) of the method which consists in depositing a molybdenum metallic layer 4 by a conventional deposition technique, in particular by the PVD (Physical Vapor Deposition) technique. The temperature of the deposit is about 100° C. so as to be lower than third of the melting temperature of the metallic material and to avoid restoring the defects created by the ionic bombarding at the underlying base surface 2. The metallic layer 4 is deposited over about one micrometer so that its thickness is larger than or equal to at least three times the PV roughness of the base surface 2 over which the metallic layer 4 is deposited. Thus, it is possible to fill the irregularities of the PV roughness and avoid duplicating it at the exposed surface 5. The roughness reached at the exposed surface 5 of the metallic layer 4 is thus comprised between 2 and 6 nanometers and the PV roughness is comprised between 25 and 100 nm.

Because of the presence of the film 3 implanted at the surface 2, the deposition of the metallic layer 4 is decorrelated from the surface grains of the base substrate 1. The deposit tends to be columnar and the obtained grains present a size which is limited by the deposited thickness and which remains, in all cases, smaller than the size of the grains of the base substrate 1.

According to another possibility, the deposited metallic layer 4 may be constituted by a metallic material other than Mo. Preferably, this material may be chosen among the metals that present a CTE close to the CTE of the sintered base substrate 1, for example tungsten, molybdenum, tantalum, rhenium, niobium or the alloys of these metals.

FIG. 5 illustrates step d) of the method which consists in performing a mechano-chemical polishing at the exposed surface 5 of the deposited Mo metallic layer 4 so as to obtain the bonding surface 500 adapted to direct bonding. To this end, an aqueous solution of colloidal silica comprising an oxidizing agent H2O2 is used for a polishing which lasts about three minutes. The roughness of the thus obtained bonding surface 500 is of about 0.6 nanometers and the PV roughness of the surface 500 is of about 7 nanometers. The condition of this bonding surface 500 is then compatible with a direct metallic bonding. In particular, it is possible to obtain a direct bonding at ambient temperature.

FIG. 6 illustrates step e) of the method which consists in bringing into contact and bonding the bonding surface 500 on a receiving surface 6 of a solid silicon receiver substrate 7 which may have been functionalized beforehand, so as to obtain a functionalized structure 800 with a metallic base.

According to another possibility, the receiver substrate 7 may comprise a semiconductor material other than silicon, in particular chosen among Ge, SiC, SiGe or a binary, ternary, quaternary material formed from the elements III and V such as GaN, InGaN, and AlGaN.

According to a non illustrated variant, the receiver substrate 7 may comprise a functionalized layer of semiconductor material at the receiving surface 6.

The functionalities of the receiver substrate 7 may comprise in particular components for LEDs, solar cells, power diodes or transistors.

Thus, the present invention proposes a method for obtaining a bonding surface 500 of a metallic support substrate 100 which is inexpensive in order to carry out a direct bonding, for example at ambient temperature, on a functionalized receiver substrate 7, comprising in particular at least one layer of a semiconductor material, advantageously monocrystalline, so as to manufacture at low cost, functionalized 3D structures 800 which are reliable over time.

It goes without saying that the invention is not limited to the variants described above as examples, but it encompasses all technical equivalents and variants of the described means as well as their combinations.

The invention claimed is:

1. A method for obtaining a bonding surface of a sintered metallic support substrate adapted to direct bonding comprising the steps of:
   a) providing a sintered metallic base substrate which presents a base surface including a RMS roughness lower than 6 nanometers and a PV roughness lower than 100 nanometers,
   b) bombarding said base surface with ionic species,
   c) depositing a metallic layer over said base surface, stacking of said base substrate and said metallic layer forming the sintered metallic support substrate, and
   d) performing a mechanical and/or chemical polishing of an exposed surface of the metallic layer so as to obtain the bonding surface adapted to the direct bonding.

2. The method according to claim 1, wherein step d) is carried out so that the bonding surface has a RMS roughness lower than 0.6 nanometers and a PV roughness lower than 10 nanometers.

3. The method according to claim 1, wherein prior to step a), the method further comprises a step i) of performing a mechanical polishing of the base surface.

4. The method according to claim 1, wherein the metallic layer is formed of the same metallic material as the base substrate.

5. The method according to claim 1, wherein the method further comprises, after step d), a step e) of directly bonding the bonding surface over a receiving surface of a receiver substrate.

6. The method according to claim 5, wherein the receiver substrate includes at least one functionalized layer of semiconductor material at the receiving surface.

7. The method according to claim 1, wherein the base substrate comprises a sintered metallic material chosen among the refractory transition metals.

8. The method according to claim 1, wherein step b) of bombarding with ionic species is carried out at a dose comprised between $1^E13$ and $5^E17$ at/cm$^2$ by ion implantation at an energy comprised between 500 eV and 250 keV or by plasma immersion at an energy comprised between 500 eV and 50 keV.

9. The method according to claim 1, wherein the ionic species are obtained from at least one element selected from the group consisting of He, Ne, Ar, Kr, and Xe.

10. The method according to claim 1, wherein the step c) of metallic layer deposition is carried out until reaching a metallic layer thickness larger than or equal to three times the PV roughness of the base surface that has been obtained at step b).

11. The method according to claim 1, wherein the deposition step c) is carried out at a temperature lower than third of the melting temperature of the material of the deposited metallic layer.

12. A structure, wherein the structure comprises successively from its base to its surface, a sintered metallic base substrate whose base surface is formed, at least in part, of a metallic material comprising ionic species implanted by bombarding on the base surface, a metallic layer with a chemical composition identical to that of the metallic base substrate, stacking of the base substrate and of the metallic layer forming a sintered metallic support substrate including a bonding surface presenting a RMS roughness lower than 0.6 nanometers and a PV roughness lower than 10 nanometers.

13. The structure according to claim 12, wherein the bonding surface is sealed directly to a receiving surface of a receiver substrate by direct bonding.

14. The structure according to claim 13, wherein the receiver substrate comprises at least one functionalized layer of a semiconductor material at the receiving surface.

15. The structure according to claim 14, wherein the metallic material of the sintered base substrate is chosen among the refractory transition metals and wherein the functionalized layer of semiconductor material forms the receiver substrate and comprises at least one selected from the group consisting of Si, Ge, SiGe, SiC, and binary, ternary, or quaternary materials formed from the elements of Group III and Group V.

* * * * *